(12) United States Patent
Andreaco et al.

(10) Patent No.: US 8,535,441 B2
(45) Date of Patent: Sep. 17, 2013

(54) CRYSTAL GROWTH CRUCIBLE LID

(75) Inventors: Mark S. Andreaco, Knoxville, TN (US);
Troy Marlar, Knoxville, TN (US);
Brant Quinton, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 287 days.

(21) Appl. No.: 12/849,042

(22) Filed: Aug. 3, 2010

(65) Prior Publication Data

US 2012/0031325 A1 Feb. 9, 2012

(51) Int. Cl.
*C30B 15/10* (2006.01)

(52) U.S. Cl.
USPC ........... 117/217; 117/200; 117/206; 117/208; 117/222; 428/34.1; 428/44; 428/45; 428/52; 428/57; 428/58; 428/64.1; 428/66.6; 428/68; 428/586; 428/596; 428/615; 428/635; 428/636; 428/655; 428/660; 428/661

(58) Field of Classification Search
USPC ......... 117/200, 206, 208, 217, 222, 931–932; 428/34.1, 44–45, 52, 57–58, 64.1, 66.6, 68, 428/586, 596, 615, 635, 636, 655, 660, 661
See application file for complete search history.

(56) References Cited

U.S. PATENT DOCUMENTS

| | | | |
|---|---|---|---|
| 3,551,115 A * | 12/1970 | Jamieson et al. | 117/217 |
| 4,224,099 A | 9/1980 | McGill | |
| 4,243,471 A | 1/1981 | Ciszek et al. | |
| 4,478,676 A | 10/1984 | Belt et al. | |
| 7,491,270 B2 | 2/2009 | Sasaki et al. | |
| 7,608,173 B2 | 10/2009 | Manens et al. | |
| 2006/0216908 A1* | 9/2006 | Boyle et al. | 438/455 |
| 2007/0080042 A1* | 4/2007 | Keating | 192/107 R |
| 2008/0127886 A1* | 6/2008 | Sasaki et al. | 117/217 |

OTHER PUBLICATIONS

A.S. Darling et al, "The Elastic and Plastic Properties of the Platinum Metals", Platinum Metals Rev., 1966, vol. 10 pp. 14-19.
E-Zlok Data Sheet, Carbon Steel Mechanical Properties, http//:www.ezlok.com/TechnicalInfo/MPCarbonSteel.html, 1 page, printed on Nov. 29, 2012.

* cited by examiner

*Primary Examiner* — Michael Kornakov
*Assistant Examiner* — Kenneth A Bratland, Jr.
(74) *Attorney, Agent, or Firm* — Peter Kendall

(57) ABSTRACT

A lid for a crystal growth chamber crucible is constructed by forming arcuate sector-shaped portions and coupling them in abutting relationship, for example by welding, to form an annular profile fabricated lid. The arcuate sector-shaped portions may be formed and removed from a lid fabrication blank with less waste than when unitary annular lids are formed and removed from a similarly sized fabrication blank. For example, the sector-shaped portions may be arrayed in an undulating pattern on the fabrication sheet.

10 Claims, 3 Drawing Sheets

CRYSTAL GROWTH CRUCIBLE LID

BACKGROUND OF THE DISCLOSURE

1. Field of the Invention

The invention relates to crystal growth apparatus and particularly to a lid structure for a crystal growth crucible.

2. Description of the Prior Art

In the known Czochralski crystal growth method and apparatus, a heated crucible containing a melt often has an annular-shaped lid, also known as a "washer" for regulating thermal gradients within the crucible. Often the crucible and lid are constructed of a noble metal, such as iridium. A seed rod is inserted through the central aperture of the annular lid and oriented proximal the melt, so as to form a solid crystalline structure on the rod tip. As the seed rod is withdrawn from the crucible at a controlled rate an elongated crystal is formed. Structure and operation of crystal growth apparatus are generally known in the crystal fabrication art.

Crucible lids may be constructed by removing a generally annular planar-shaped ring from a metal blank sheet, analogous to forming a cookie from a sheet of dough. Fabrication waste remnants, typically iridium, left after removal of the lid from the sheet blank is valuable and is recycled by re-forming into a new sheet. As one skilled in the art can appreciate, removal of only an annular ring from a larger blank sheet likely creates a larger volume of remnant waste than the actual ring. Considerable effort is expended to form lid fabrication blanks, with a relatively low yield of finished lid product. Thus, a need exists in the art for a lid structure and fabrication method that reduces fabrication waste while increasing potential fabrication yield of lids.

SUMMARY OF THE INVENTION

Accordingly, an object of the invention is to increase the quantity of lid component structure and reduce fabrication waste for lid fabrication blanks.

These and other objects are achieved in accordance with the present invention by forming arcuate sector-shaped portions and coupling them in abutting relationship, for example by welding, to form an annular profile fabricated lid. The arcuate sector-shaped portions may be formed and removed from a lid fabrication blank with less waste than when unitary annular lids are formed and removed from a similarly sized fabrication blank. For example, the sector-shaped portions may be arrayed in an undulating pattern on the fabrication sheet.

One aspect of the present invention is directed to a lid for a crystal growth crucible, where the lid is formed from a plurality of generally arcuate sector portions coupled together and forming a generally planar annular body.

Another aspect of the present invention is directed to a method for fabricating a lid for a crystal growth crucible. A plurality of generally arcuate sector portions are fabricated. At least two of the arcuate sector portions are oriented in abutting relationship to form at least a portion of a generally planar annular body. The at least two oriented arcuate sector portions are coupled together along the respective abutting portions to form a larger unitized arcuate sector. The orienting and coupling steps are repeated in any sequence to form a generally planar annular fabricated unitized body.

In another aspect of the present invention a lid for a crystal growth crucible is formed by the method comprising orienting and welding a plurality of generally arcuate sector portions in abutting relationship to form a generally planar annular body having weldments between each abutting sector. If desired, additional weldment lines may be arrayed on the lid exterior surface for structural reinforcement and/or heat transfer property modification of the lid structure.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

After considering the following description, those skilled in the art will clearly realize that the teachings of my invention can be readily utilized in fabrication of a crucible lid in a manner that reduces fabrication waste than known unitary crucible lid fabrication methods. Crucible lids constructed in accordance with the teachings of the present invention are capable of being utilized in crystal growth apparatus in the same manner as prior unitary construction lids, with less fabrication waste.

Figure 1:
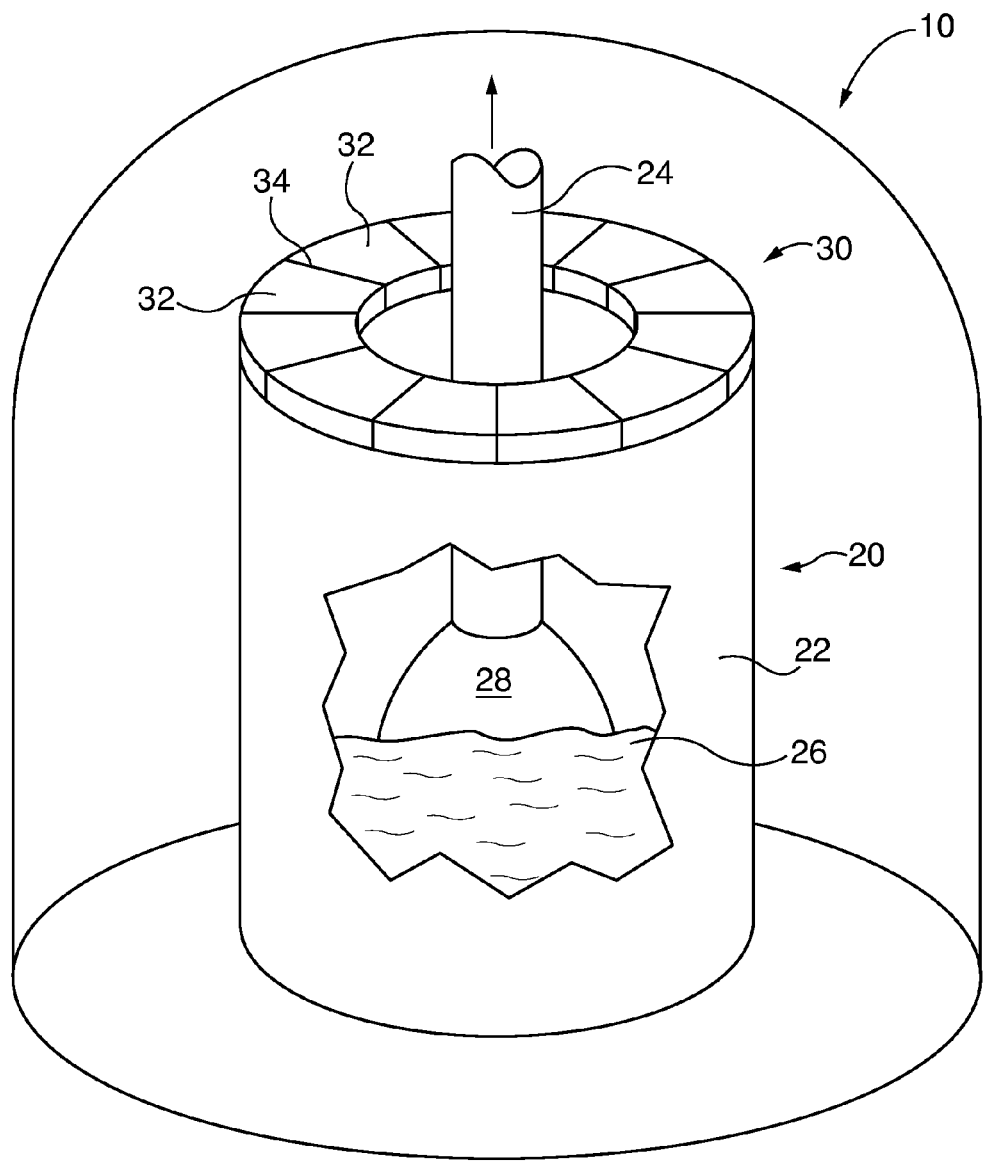
FIG. 1 shows a schematic perspective view of a crystal growth chamber having the crucible lid of the present invention.

FIG. 1 shows schematically an exemplary crystal growth chamber 10 constructed and operated in accordance with prior art teachings. The growth chamber 10 includes a crucible assembly 20, including a crucible 22, a retractable seed rod 24 having a tip proximal melt 26, and crystal 28. Crucible lid 30 of the present invention covers the crucible 22, and has a generally annular-shape planform that is fabricated from arcuate sector-shaped portions that are coupled together, such as by weldment lines 34. As the present invention is directed to the crucible lid 30 structure and fabrication, for brevity details concerning general construction and operation of the growth chamber 10 are not discussed herein.

Figure 2:
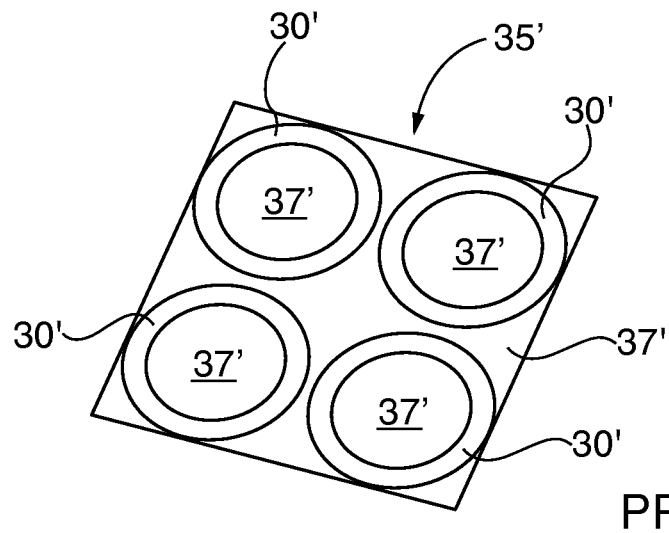
FIG. 2 shows a perspective view of a prior art method of forming a prior art crucible lid from a blank fabrication sheet.

Known unitary construction crucible lids 30' shown in FIG. 2 were fabricated by removing the unitary annular-shaped structure from a lid fabrication blank 35', analogous to cutting a cookie from a sheet of dough. After removal of the known annular lids 30' that define a surface area, a relatively larger surface area of fabrication waste 37', in the form of large circles removed to form the ring inner diameter and the large perforated rectangular sheet remnant is recycled by forming a portion of a new fabrication blank. Considerably intensive effort is expended to form new fabrication blanks relative to the useful output of annular crucible lid rings 30'.

Figure 3:
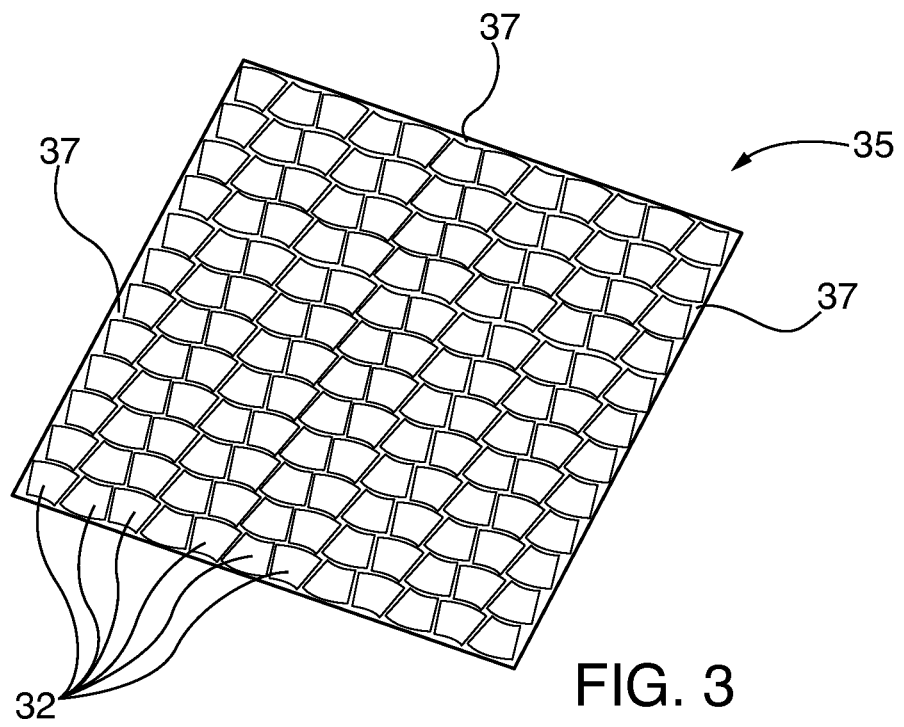
FIG. 3 shows a perspective view of a method of forming a crucible lid of the present invention by removing arcuate sector-shaped portions from a blank fabrication sheet with less fabrication waste than the prior art method of FIG. 2.

In the present invention, as shown in FIG. 3, sector-shaped arcuate portions 32 are arrayed on the fabrication blank 35, so as to reduce fabrication waste 37 surface area relative to the usable surface area of the portions 32. As shown in the figure, one skilled in the art may wish, but is not required, to array the sector portions 32 in an undulating, wavy ribbon pattern, so as to reduce the number of linear cuts and waste otherwise expended on a given lid fabrication blank. A relatively higher yield of usable lid components and relatively lower yield of fabrication waste is thus possible by utilization of the present invention.

Figure 4:
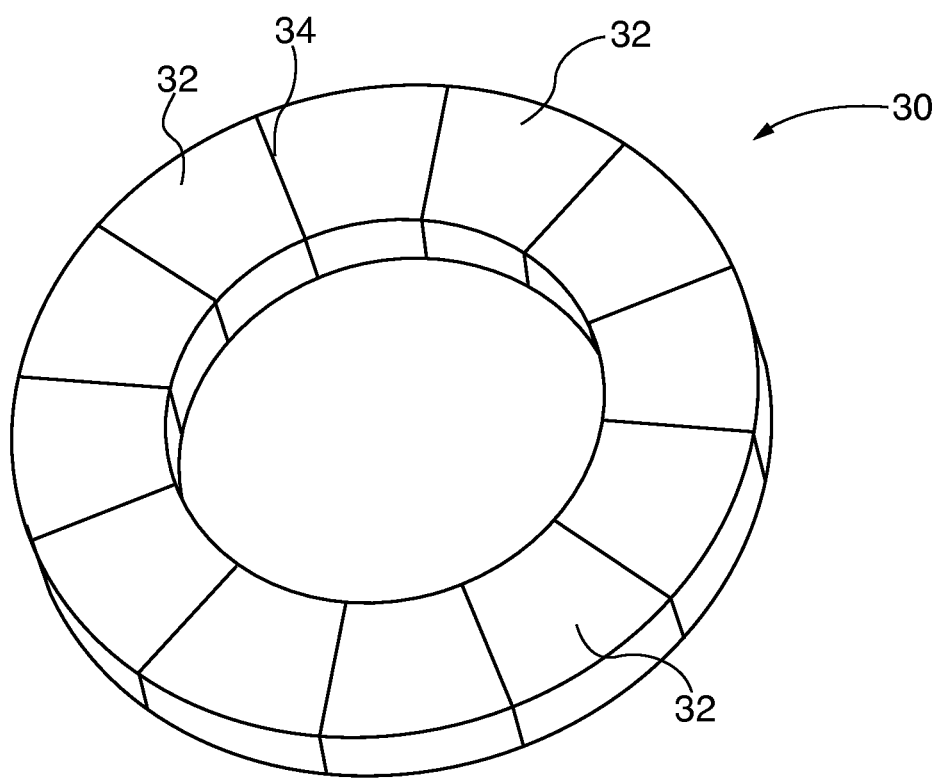
FIG. 4 shows a perspective view of a crucible lid of the present invention.

As shown in FIG. 4, the arcuate sector-shaped portions 32 are arrayed in abutting relationship to form a generally annular planform fabricated lid 30. The portions 32 are coupled or otherwise joined together using known metal forming techniques, such as by tungsten inert gas (TIG) welding to form weldment lines 34. At the discretion of the manufacturer, the weldment lines 34 or any other portion of the surface of the lid 30 may be subject to further metal treatment. If desired by the manufacturer, additional weldment lines 34 may be arrayed on the lid 30 surface to modify the lid's structural and/or heat transfer properties.

The number of arcuate sector-shaped portions 32 and their dimensions, as well as material specifications, are defined at the discretion of the manufacturer. An exemplary lid 30 may be constructed of known iridium alloy or other noble metal utilized in the crystal growth arts, having an outer diameter of roughly 6.5 inches (165 millimeters) and a thickness of 0.130 inch (3.3 millimeters).

Although various embodiments which incorporate the teachings of the present invention have been shown and described in detail herein, those skilled in the art can readily devise many other varied embodiments that still incorporate these teachings.

What is claimed is:

1. A lid for a crystal growth crucible, comprising a plurality of generally arcuate sector portions, constructed of iridium, that are coupled together along entire respective abutting radial faces and forming a solid unistructural generally planar annular body having exposed circumferential edges and axial faces.

2. The lid of claim 1, wherein the arcuate sector portions are coupled by weldments.

3. A method for fabricating a lid for a crystal growth crucible, comprising:
    fabricating a plurality of generally arcuate sector portions that are constructed of iridium;
    orienting radial faces of at least two of the arcuate sector portions in abutting relationship to form at least a portion of a generally planar annular body;
    coupling the at least two oriented arcuate sector portions together along an entire length of the respective abutting radial faces to form a larger unitized arcuate sector; and
    repeating the orienting and coupling steps in any sequence to form a generally planar annular solid unistructural body having exposed circumferential edges and axial faces.

4. The method of claim 3, wherein the fabricating is performed by removing the arcuate sector portions from a common sheet of blank material.

5. The method of claim 4, wherein the number of plurality of arcuate sector portions and their dimensions is determined by reducing blank material waste not used to form said sector portions.

6. The method of claim 4, wherein at least a portion of the plurality of arcuate sector portions are arrayed in an undulating ribbon on the common sheet of blank material prior to their removal.

7. The method of claim 4, wherein the plurality of arcuate sector portions are removed from the common sheet of blank material by a cutting process.

8. The method of claim 3, wherein the coupling is performed by welding the abutting portions and fanning a weldment line.

9. A lid for a crystal growth crucible, formed by the method of claim 3.

10. A lid for a crystal growth crucible having exposed circumferential edges and axial faces, formed by the method comprising orienting and welding a plurality of iridium generally arcuate sector portions in abutting relationship to form a generally planar annular solid unistructural body having weldments along an entire length between each respective abutting sector.

* * * * *